(12) United States Patent
Goto et al.

(10) Patent No.: US 6,939,730 B2
(45) Date of Patent: Sep. 6, 2005

(54) NITRIDE SEMICONDUCTOR, SEMICONDUCTOR DEVICE, AND METHOD OF MANUFACTURING THE SAME

(75) Inventors: Osamu Goto, Miyagi (JP); Takeharu Asano, Miyagi (JP); Motonobu Takeya, Miyagi (JP); Katsunori Yanashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/131,694

(22) Filed: Apr. 24, 2002

(65) Prior Publication Data

US 2003/0020087 A1 Jan. 30, 2003

(30) Foreign Application Priority Data

Apr. 24, 2001 (JP) ..................................... P2001-167470

(51) Int. Cl.$^7$ ............................................. H01L 21/20
(52) U.S. Cl. ................................ 438/22; 41/44; 41/483
(58) Field of Search ....................... 438/22–47, 479–509

(56) References Cited

U.S. PATENT DOCUMENTS

| | | | |
|---|---|---|---|
| 6,403,451 B1 | * | 6/2002 | Linthicum et al. .......... 438/479 |
| 2001/0025989 A1 | * | 10/2001 | Shibuya et al. ............. 257/347 |
| 2002/0022290 A1 | * | 2/2002 | Kong et al. .................. 438/48 |
| 2002/0090816 A1 | * | 7/2002 | Ashby et al. ............... 438/686 |
| 2003/0143765 A1 | * | 7/2003 | Ishibashi et al. ............. 438/21 |

FOREIGN PATENT DOCUMENTS

| | | |
|---|---|---|
| JP | 5223600 | 2/1977 |
| JP | 3132015 | 6/1991 |
| JP | 1192296 | 6/1999 |

OTHER PUBLICATIONS

D.B. Thomson, et al., Ranges of Deposition Temperatures Applicable for Metalorganic Vapor Phase Epitaxy of Films Via the Technique of Pendeoepitaxy, MRS Internet J. Nitride Semicond. Res. 4S1, G3.37 (1999).

Tsvetanka S. Zheleva, et al., Pendeo–Epitaxy: A New Approach for Lateral Growth of Gallium Nitride Films, J. Electronic Materials, 28, L5, 1999.

(Continued)

Primary Examiner—Savitri Mulpuri
(74) Attorney, Agent, or Firm—Sonnenschein, Nath & Rosenthal LLP

(57) ABSTRACT

Provided is a nitride semiconductor having a larger low-defective region on a surface thereof, a semiconductor device using the nitride semiconductor, a method of manufacturing a nitride semiconductor capable of easily reducing surface defects in a step of forming a layer through lateral growth, and a method of manufacturing a semiconductor device manufactured by the use of the nitride semiconductor. A seed crystal portion is formed into stripes on a substrate with a buffer layer sandwiched therebetween. Then, a crystal is grown from the seed crystal portion in two steps of growth conditions to form a nitride semiconductor layer. In a first step, a low temperature growth portion having a trapezoidal-shaped cross section in a layer thickness direction is formed at a growth temperature of 1030° C., and in a second step, lateral growth predominantly takes place at a growth temperature of 1070° C. Then, a high temperature growth potion is formed between the low temperature growth portions. Thereby, hillocks and lattice defects can be reduced in a region of the surface of the nitride semiconductor layer above the low temperature growth portion.

27 Claims, 12 Drawing Sheets

OTHER PUBLICATIONS

K. Linthicum, et al., Pendeoepitaxy of Gallium Nitride Thin Films, Appl. Phys. Lett. 75, 196, 1999.

K.J. Linthicum, et al., Process Routes for Low Defect–Density Gan on Various Substrates Employing Pendeo–Epitaxial Growth Techniques, MRS Internet J. Nitride Semicond. Res. 4S1, G4.9 (1999).

T. Gehrke, et al., Pendeo–Epitaxy of Gallium Nitride and Aluminum Nitride Films and Heterostructures on Silicon Carbide Substrate, MRS Internet J. Nitride Semicond. Res. 4S1, G3.2 (1999).

Y. Chen, et al., Dislocation Reduction in GaN Thin Films Via Lateral Overgrowth from Trenches, Appl. Phys. Lett., 75, 2062 (1999).

O. Nam, et al., Lateral Epitaxy of Low Defect Density GaN Layers Via Organometallic Vapor Phase Epitaxy, Appl. Phys. Lett., 71, 2638 (1999).

Tsvetanka S. Zheleva, et al., Pendeo–Epitaxy—A New Approach for Lateral Growth of Gallium Nitride Structures, MRS Internet J. Nitride Semicond. Res., 4S1, G3.38 (1999).

Tsvetanka S. Zheleva, et al., Dislocation Density Reduction Via Lateral Epitaxy in Selectively Grown GaN Structures, Appl. Phys. Lett., 71, 2472 (1997).

R.F. Davis, et al., Pendeo–Epitaxial Growth and Characterization of GaN and Related Materials on 6H–SiC(0001) and Si(111) Substrates, MRS Internet Semicond. Res. 5S1, W2.1 (1999).

* cited by examiner

NITRIDE SEMICONDUCTOR, SEMICONDUCTOR DEVICE, AND METHOD OF MANUFACTURING THE SAME

RELATED APPLICATION DATA

The present application claims priority to Japanese Application(s) No(s). P2001-167470 filed Apr. 24, 2001, which application(s) is/are incorporated herein by reference to the extent permitted by law.

BACKGROUND OF THE INVENTION

1. Field of the Invention

The present invention relates to a nitride semiconductor used for manufacturing, for example, a semiconductor laser device, a semiconductor device using the nitride semiconductor, and a method of manufacturing the nitride semiconductor and the semiconductor device.

2. Description of the Related Art

In recent years, attention has been given to Group III–V compound semiconductors as device materials because of their various properties. Specifically, Group III–V material systems are direct transition type, and their forbidden bandwidths range from 1.9 eV to 6.2 eV, so only the material systems can emit light in a wide range from a visible region to an ultraviolet region. Therefore, the development of the material systems as materials of semiconductor light-emitting devices such as semiconductor lasers and light-emitting diodes (LEDs) has been actively pursued. Moreover, in addition to wider forbidden bandwidths, as their saturated electron velocities and dielectric breakdown electric fields can be expected to become higher, so in respect of high-temperature operation, high-rate switching operation, large current operation and so on, applications of the material systems as devices operated in an region where conventional Si material systems or GaAs material systems are inoperable in principle have been researched.

Gallium nitride semiconductors such as GaN, AlGaN and GaInN among the Group III–V compound semiconductors are material systems which are increasingly applied to devices, and such semiconductor devices are conventionally manufactured by laminating a gallium nitride semiconductor film on a surface of a crystal substrate or a crystal film. The crystal substrate (or the crystal film) is preferably made of a bulk crystal of a gallium nitride compound, although it is difficult to manufacture the bulk crystal of this kind. Therefore, as a matter of fact, a gallium nitride compound is grown on a substrate made of sapphire ($\alpha$-$Al_2O_3$), silicon carbide (SiC) or the like through epitaxial growth in the majority of cases.

However, there are large differences in lattice mismatch and thermal expansion coefficient between a substrate material such as sapphire and the gallium nitride compound, and in order to ease the distortions, lattice defects such as dislocation occur in a layer made of the gallium nitride compound. A portion where the lattice defects exist becomes the center of a non-radiative recombination which emits no light even though electrons and holes are recombined or a point where a current leaks, thereby resulting in impaired properties of the semiconductor device.

Therefore, crystal growth to remove defects from the gallium nitride compound has been studied, and growth techniques using a property that in a crystal grown in a lateral direction with respect to a seed crystal, which is a base for growth, that is, in a horizontal direction with respect to a surface of a layer to be formed, fewer dislocations derived from the seed crystal exist is being applied to GaAs crystals and GaN crystals at present.

For example, in Japanese Unexamined Patent Application No. Hei 10-312971, the following method is adopted. A GaN layer is formed on a sapphire substrate, and a growth inhibition layer made of $SiO_2$ (silicon dioxide) is formed on a surface of the GaN layer, then a GaN crystal is grown from a GaN surface as a base which is exposed via the growth inhibition layer. According to the method, the growth of dislocations can be inhibited by the growth inhibition layer, so dislocations which penetrate the crystal to reach to a surface of the crystal (so-called threading dislocations) are reduced. However, in an aperture portion of the growth inhibition layer, dislocations passing through the aperture portion and then penetrating the crystal exist, so dislocations or defects partially increase in a region above an aperture portion of the gallium nitride semiconductor layer.

Moreover, there is the following method as a technique of another type. For example, a large number of seed crystal portions are formed from a GaN layer through patterning, and crystal growth takes place in a lateral direction from the seed crystal portions as bases, and then, crystals grown in a lateral direction meet one another between the seed crystal portions. However, even in this method, dislocations propagate toward top surfaces of the seed crystal portions, so regions directly above the seed crystal portions become regions where a large number of dislocations or defects locally exist. Therefore, even if these methods are used, surface defects in the gallium nitride semiconductor on the substrate cannot be sufficiently reduced.

Further, lateral growth in these methods is not perfect selective growth, so a crystal is grown in a lateral direction as well as in an upward direction at the same time. Thereby, while the crystal is sufficiently grown in a lateral direction, the thickness of the crystal is increasing more and more, which may result in the occurrence of warpage in the gallium nitride semiconductor layer formed. Therefore, the same inventors as those of the present invention have previously attempted to grow a gallium nitride semiconductor at a higher temperature than before so that lateral growth predominantly take place to make the layer thickness thinner. The higher the growth temperature is, the higher directivity of a growth direction increases, and thereby lateral growth is promoted, but in this case, defects called hillocks may occur on the layer surface. The hillocks are crater-like projections with a diameter ranging from 70 $\mu$m to 100 $\mu$m and a height of about 0.7 $\mu$m, and experiments have revealed that the hillocks have a tendency to occur mainly in a region directly above the seed crystal portion (or the aperture portion of the growth inhibition layer). Defects occur in a semiconductor layer grown on the hillocks, which may result in impaired properties of a semiconductor device manufactured. In a semiconductor laser, when a laser stripe is formed on the hillocks, there is a decline in reliability of the laser such as a decline in a laser static property and a shortening of the life of the laser.

SUMMARY OF THE INVENTION

In view of the forgoing, it is a first object of the present invention to provide a nitride semiconductor having a larger low-defective region on its surface and a semiconductor device using the nitride semiconductor.

It is a second object of the present invention to provide a method of manufacturing a nitride semiconductor capable of easily reducing surface defects in a step of forming a layer through lateral growth, and a method of manufacturing a semiconductor device manufactured by the use of the nitride semiconductor.

A method of manufacturing a nitride semiconductor and a method of manufacturing a semiconductor device according to the invention comprises the steps of growing a Group III–V nitride semiconductor to form a seed crystal portion; and growing a Group III–V nitride semiconductor from the seed crystal portion as a base through changing at least one of growth conditions in two or more steps to form a semiconductor layer.

A nitride semiconductor and a semiconductor device according to the invention comprises a first seed portion made of a Group III–V nitride semiconductor; a second seed crystal portion made of a Group III–V nitride semiconductor and grown from the first seed crystal portion so as to have a triangular-shaped or a trapezoidal-shaped cross section in a layer thickness direction; and a semiconductor layer made of a Group III–V nitride semiconductor and grown from the second seed crystal portion as a base.

In the method of manufacturing a nitride semiconductor and a semiconductor device according to the invention, the Group III–V nitride semiconductor is grown from the seed crystal portion as a base through changing at least one of growth conditions in two or more steps, so the semiconductor layer in which a direction where dislocations propagate is changed above the seed crystal portion and hillocks are reduced is formed.

The nitride semiconductor and the semiconductor device according to the invention comprises the second seed crystal portion having a triangular-shaped or trapezoidal-shaped cross section in a layer thickness direction and the semiconductor layer grown from the second seed crystal portion as a base, so dislocations in the crystal is bended at an interface between the second crystal portion and the semiconductor layer, thereby dislocations penetrating to the surface of the semiconductor layer is reduced.

Other and further objects, features and advantages of the invention will appear more fully from the following description.

DETAILED DESCRIPTION OF THE PREFERRED EMBODIMENTS

Preferred embodiments of the present invention are described in more detail below referring to the accompanying drawings.

[First Embodiment]

FIGS. 1A to 5B explain a method of manufacturing a nitride semiconductor according to a first embodiment of the invention in order. In the embodiment, firstly, a method of manufacturing a nitride semiconductor is described below referring to these drawings. The term nitride semiconductor here indicates a gallium nitride compound including gallium (Ga) and nitrogen (N), such as GaN, AlGaN (aluminum gallium nitride) mixed crystal, or AlGaInN (aluminum gallium indium nitride) mixed crystal. They contains n-type impurities made of a Group IV element such as Si (silicon), Ge (germanium), O (oxygen) and Se (selenium) and a Group VI element, or p-type impurities made of a Group II element such as Mg (magnesium), Zn (zinc) and C (carbon) and a Group IV element, if necessary.

Figure 1A:
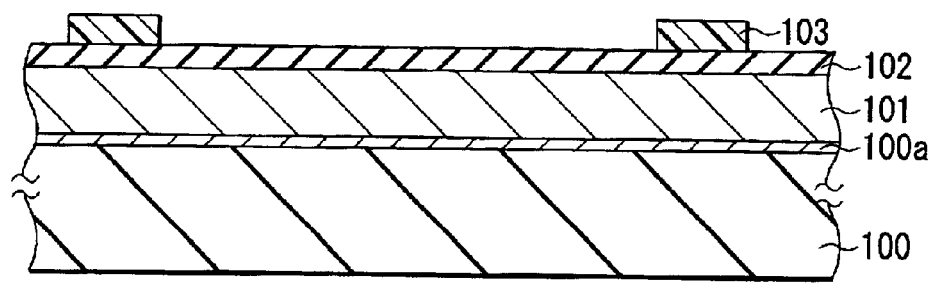
FIGS. 1A, 1B, 1C and 1D are cross-sectional views for explaining steps in a method of manufacturing a nitride semiconductor according to a first embodiment of the invention.

Firstly, as shown in FIG. 1A, a substrate 100 made of, for example, $Al_2O_3$ (sapphire) is prepared. Instead of $Al_2O_3$, the substrate 100 can be made of Si (silicon), SiC (silicon carbide), GaAs (gallium arsenide), $MgAl_2O_4$ (magnesium aluminum oxide), $LiGaO_2$ (lithium gallium oxide), GaN or the like. On the substrate 100 (for example, on a (0001) surface), a buffer layer 100a made of GaN, AlN, AlGaN or the like is formed. Next, on the buffer layer 100a, GaN:Si is grown to form a seed crystal layer 101 of, for example, 2 μm thick. Further, on the seed crystal layer 101, a $SiO_2$ (silicon dioxide) film 102 of, for example, 0.9 μm thick and a photo resist film 103 of 1.3 μm thick are formed in order. The $SiO_2$ film 102 may be made of $Si_XN_Y$ (silicon nitride, X and Y are given values), or may be made of a laminated film of $SiO_2$ and $Si_XN_Y$.

Incidentally, in the embodiment, the growth of a crystal layer of the nitride semiconductor takes place through, for example, MOCVD (Metal Organic Chemical Vapor Deposition). In this case, $(CH_3)_3Ga$ (trimethyl gallium, TMG) as a source gas of Ga (gallium), $(CH_3)_3Al$ (trimethyl aluminum) as a source gas of aluminum, $(CH_3)_3In$ (trimethyl indium) as a source gas of indium and ammonia as a source gas of nitrogen are used. Further, monosilane is used as a source gas of Si (silicon), and $(C_5H_5)_2Mg$ (biscyclo-pentadienyl magnesium) is used as a source gas of Mg (magnesium).

Next, the photo resist film 103 is patterned into stripes through photolithography. The photo resist film 103 is formed into stripes, for example, with a width of 2 μm and a period of about 13.5 μm extending in a direction indicated in $<1\bar{1}00>$. The direction indicated in $<1\bar{1}00>$ is hereinafter referred to as <1-100>.

Figure 1B:
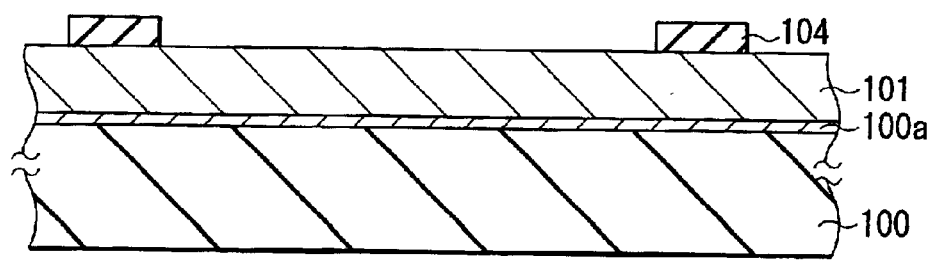

Then, as shown in FIG. 1B, the $SiO_2$ film 102 is etched by the use of the photo resist film 103 as a mask, and the $SiO_2$ film 102 is partially removed to form a mask pattern 104. After forming the mask pattern 104, the photo resist film 103 is removed through oxygen ashing, a process using acetone or the like.

Figure 1C:
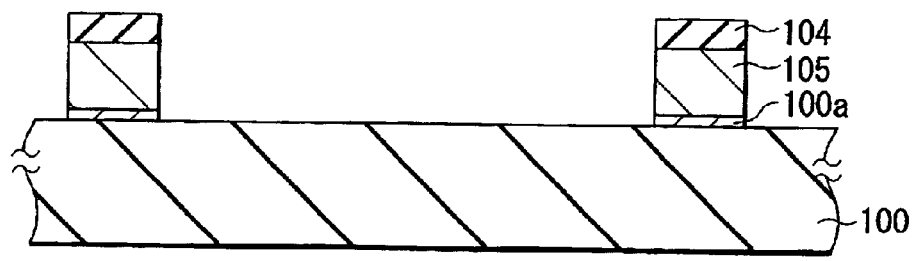

Next, as shown in FIG. 1C, dry etching such as RIE (Reactive Ion Etching) is carried out to remove portions of the seed crystal layer 101 and the buffer layer 100a where the mask pattern 104 is not coated. Thereby, stripe-shaped seed crystal portions 105 separated from each other are formed.

Figure 1D:
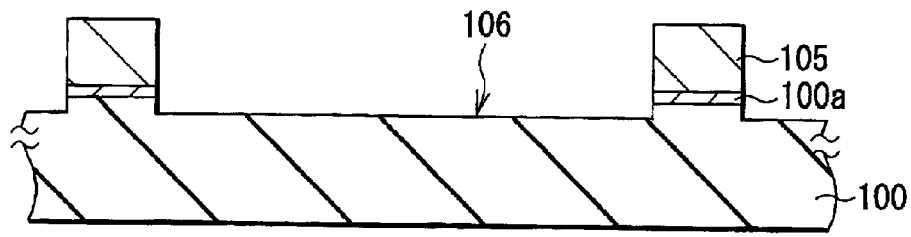

Then, dry etching is carried out by the use of the mask pattern 104 to slightly remove an upper portion of the substrate 100, for example, a portion from the surface to a depth of about 200 nm, and thereby, a groove portion 106 shown in FIG. 1D is formed. When the groove portion 106 is not formed, a growth layer contacts the surface of the substrate 100 during lateral growth from the seed crystal portions 105 to be described later, which may lead to an occurrence of defects in the layer due to stress distortion. Next, the mask pattern 104 made of $SiO_2$ is removed by the use of, for example, a hydrofluoric solution.

Figure 2:
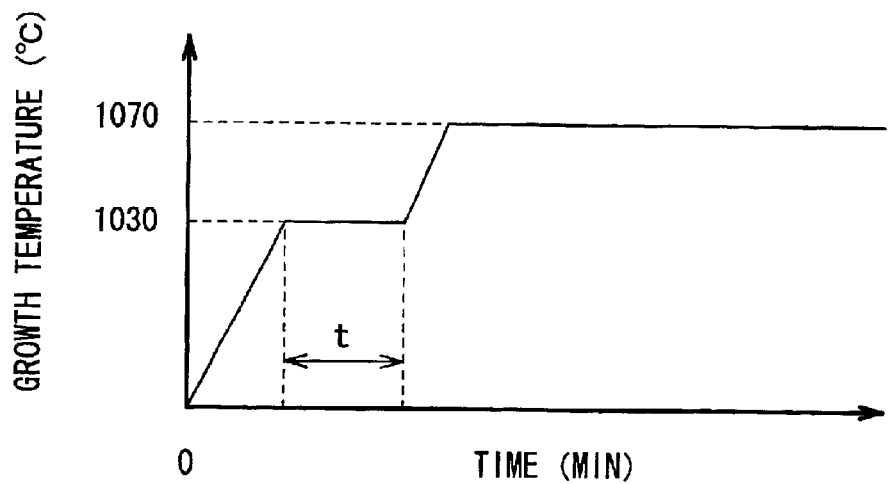
FIG. 2 is a graph for explaining adjustments of the growth temperature of the nitride semiconductor according to the first embodiment of the invention.

Next, GaN:Si is grown from each of the seed crystal portions 105 as a base to form a nitride semiconductor layer 107. At this time, a crystal is grown through changing growth conditions twice or more, and in the embodiment, as shown in FIG. 2, the growth is carried out through two steps of growth temperature.

In a first step, the growth temperature is set at 1040° C. or less, for example, 1030° C. As the growth temperature varies depending on kinds of susceptor and heater wire to be used and relative position of a thermocouple, the temperature is not necessarily determined, and errors due to differences of measurement systems are acceptable in the description. However, a typical growth temperature when carrying out lateral growth using such a seed crystal as a base is in the neighborhood of 1060° C., and in this case, it is preferable that the growth temperature is relatively low, that is, 1040° C. or less. At this time, a GaN:Si crystal is isotropically grown at a relatively low rate in an upward direction and in a lateral direction from a top surface and sides of the seed crystal portion 105, respectively. In addition, the lateral direction in the description indicates a direction substantially parallel to the layer surface of the nitride semiconductor layer 107.

Figure 3A:
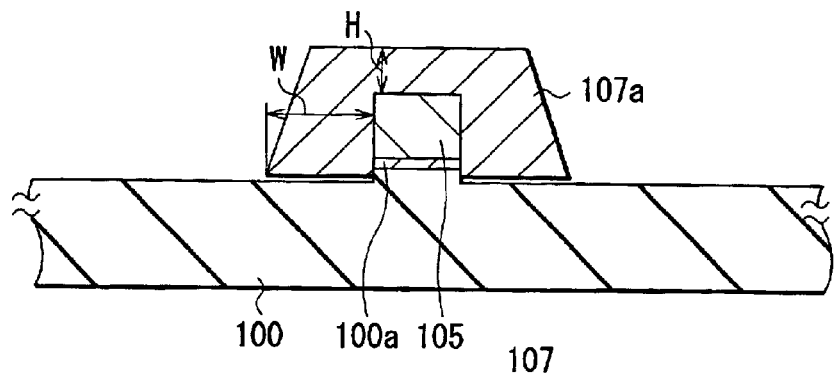
FIGS. 3A and 3B are cross-sectional views for explaining steps following the steps of FIGS. 1A to 1D.

Thereby, as shown in FIG. 3A, a low temperature growth portion 107a having a trapezoidal-shaped cross section in a layer thickness direction is formed. The height H and the width W of the low temperature growth portion 107a from the seed crystal portion 105 are not particularly limited, although, as described later, the height H relates to the surface defect density of the nitride semiconductor layer 107, so it is preferable that the low temperature growth portion 107a is grown until the height H reaches to a predetermined value of, for example, 0.5 μm or over. In the case where the growth temperature is 1030° C., the growth rate ratio (an upward direction to a lateral direction) is substantially 1-to-2. For example, after 10 minutes, the cross section of the low temperature growth portion 107a is formed in a trapezoidal shape having the height H of 0.5 μm and the width W of 1.0 μm. The oblique surfaces of the low temperature growth portion 107a are growth surfaces for lateral growth, which are facets made of crystal surfaces shown in $\{11\bar{2}2\}$. The crystal surfaces shown in $\{11\bar{2}2\}$ are hereinafter referred to as {11-22}.

Figure 3B:
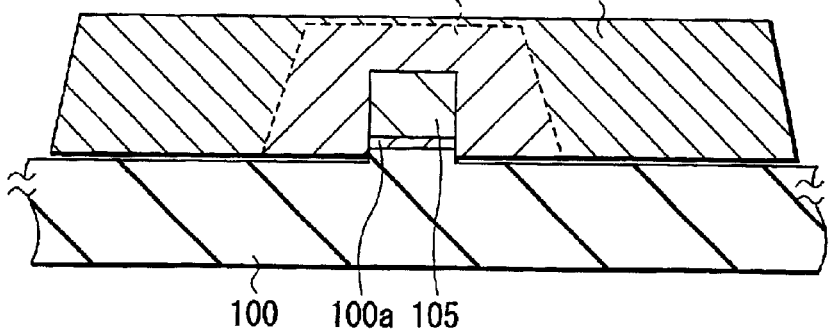
Figure 4:
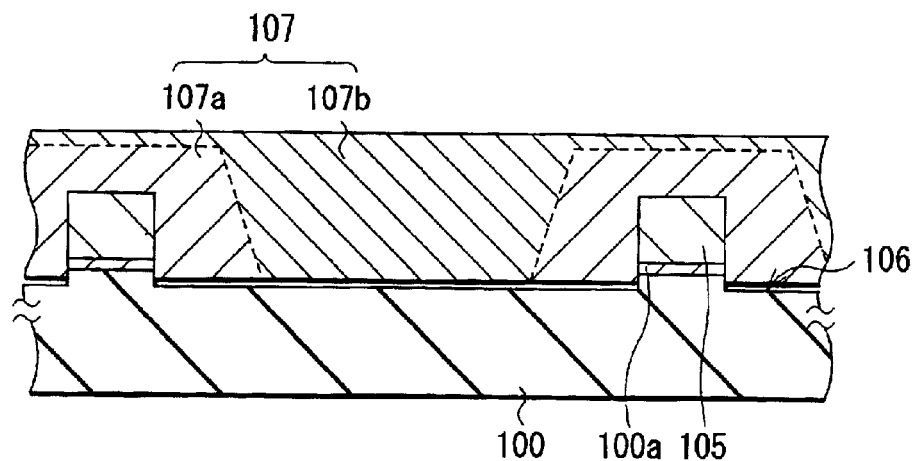
FIG. 4 is a cross-sectional view for explaining a step following the steps of FIGS. 3A and 3B.

In a second step, the growth temperature is set at 1070° C. or over as well as at a higher temperature than the growth temperature in the first step. In this case, the growth temperature is set at, for example, 1070° C. to carry out crystal growth. The GaN:Si crystal is generally grown at a higher rate than in the first step, but the growth rate is faster in a lateral direction than in an upward direction from the seed crystal portion 105, so the GaN:Si crystal is mainly grown in a lateral direction. At this time, the growth rate ratio (an upward direction to a lateral direction) is 1-to-10. Thereby, a high temperature growth portion 107b is formed. As shown in FIG. 3B, compared with the height H and the width W in the first step, in the high temperature growth portion 107b, the height H does not particularly increase, but the width W steeply increases. When the crystal is further grown, the high temperature growth portions 107b meet each other at the center of a region corresponding to a region between the seed crystal portions 105 so as to form one continuous layer. When the crystal is grown until the surface of the layer becomes flat, the nitride semiconductor layer 107 shown in FIG. 4 is completed.

Figure 5A:
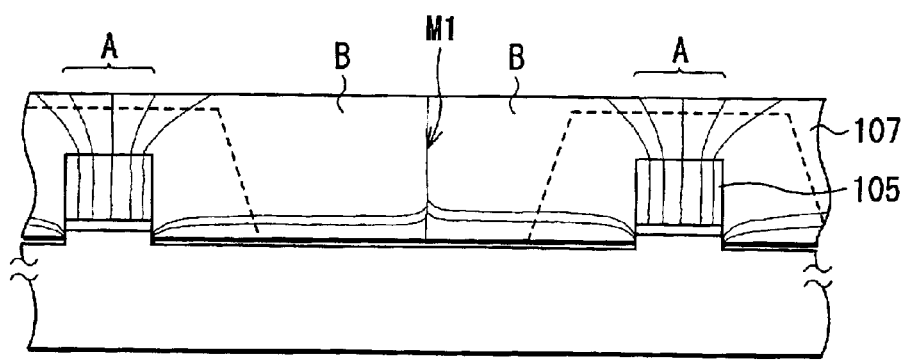
FIGS. 5A and 5B are cross-sectional views for explaining the occurrence of a dislocation density in a case where a nitride semiconductor is formed under two different conditions of growth temperature (A) and in a case where a nitride semiconductor is formed at a fixed temperature (B).

FIG. 5A shows a state in which dislocations propagate from the crystal portion 105 to the nitride semiconductor layer 107. In the nitride semiconductor layer 107 according to the embodiment, a region A directly above the seed crystal portion 105 is mainly formed of the low temperature growth portion 107a, and few hillocks (not shown) occur on the surface of the region A. Moreover, as threading dislocations in the region A are dispersed on the top surface of the nitride semiconductor layer 107 which is grown so as to extend the top surface of the seed crystal portion 105, the threading dislocation density declines. On the other hand, the threading dislocations reaching to the facets of lateral growth when forming the low temperature growth portion 107a are bended in a lateral direction along the crystal growth. Therefore, dislocations propagated from the seed crystal portion 105 in the region A are very few.

Figure 5B:
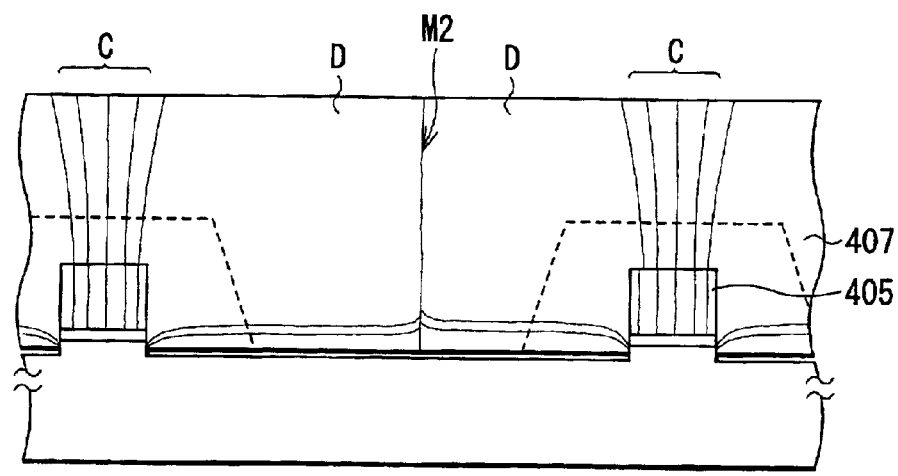

A lateral growth region B grown between the seed crystal portions 105 is mainly formed of the high temperature growth portion 107b. In the region B, threading dislocations due to a meeting of the high temperature growth portions 107b occur in a meeting portion M1, but dislocations from the seed crystal portions 105 are hard to propagate in a lateral direction, so the dislocation density becomes very low. Thereby, as the nitride semiconductor layer 107 has few portions where a large number of defects exist on the surface thereof, except for the meeting portion M1, a low-defective region on the surface is extended. Further, the high temperature growth portion 107b is rapidly grown, so a space for the region B can be extend to, for example, 16 μm so as to extend the low-defective region. As a comparison, FIG. 5B shows a crystal layer 407 conventionally grown in a lateral direction from a seed crystal portion 405 at a fixed growth temperature. The dislocation density in a lateral growth region D is nearly equal to that in the lateral growth region B shown in FIG. 5A, although a region C directly above the seed crystal portion 405 is a region where the dislocation density is as high as that in the seed crystal portion 405 because threading dislocations propagate from the seed crystal portion 405.

Further, in this case, the nitride semiconductor layer 107 is hardly grown in an upward direction in the second step, so the height H is as thin as about 3 μm. On the other hand, as the crystal layer 407 is consistently grown in an upward direction as well as in a lateral direction at the same ratio, the thickness of the crystal layer 407 becomes larger than that of the nitride semiconductor layer 107, which may result in the occurrence of warpage in the crystal layer 407. On other words, the nitride semiconductor layer 107 has a thinner layer thickness, so the occurrence of warpage in the nitride semiconductor layer 107 can be prevented.

EXAMPLES

Next, examples of the nitride semiconductor layer 107 according to the embodiment are described below.

In the same manner as the above embodiment, the seed crystal portions 105 were formed, and GaN was grown by adjusting the growth temperature according to a heat curve shown in FIG. 2 to form the nitride semiconductor layer 107. At that time, the growth temperature in the first step varied in a range from 1040° C. to 1070° C., and the growth temperature in the second step was fixed at 1070° C., and then a hillock density in the nitride semiconductor layer 107 formed was quoted.

Figure 6:
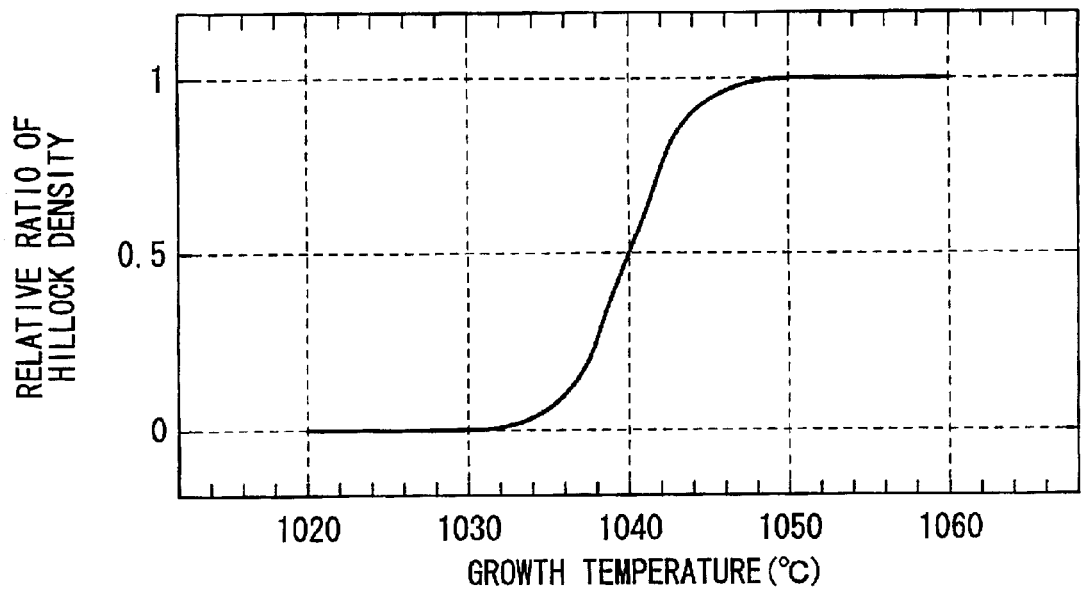
FIG. 6 is a graph showing a hillock density with respect to growth temperature in a first step in an example of the invention.

FIG. 6 shows a hillock density with respect to the growth temperature in the first step. As shown in FIG. 6, the occurrence of hillocks was in correlation with the growth temperature in the first step, and there were a low temperature region where few hillocks occurred (the relative ratio of the hillock density was 0) and a high temperature region where a large number of hillocks occurred (the relative ratio of hillock density was 1). No drastic transition occurred between the two regions, but a slight transition occurred in a region where the hillock density was changed as shown in FIG. 6. In this example, the center of the region where the transition occurred was about 1040° C. Therefore, it is evident that the growth temperature in the first step is preferably 1040° C. or less.

Moreover, in the same manner as the embodiment, in accordance with the heat curve shown in FIG. 2, the growth temperature in the first step was set at 1030° C. and the growth temperature in the second step was set at 1070° C., and then the nitride semiconductor layer 107 made of GaN was formed. At that time, each nitride semiconductor layer 107 was formed with each growth time (that is, time t in FIG. 2) of 0, 3, 4, 10 and 20 (in minute) in the first step, and the surface of each nitride semiconductor layer 107 was observed to quote the hillock density therein.

Figure 7:
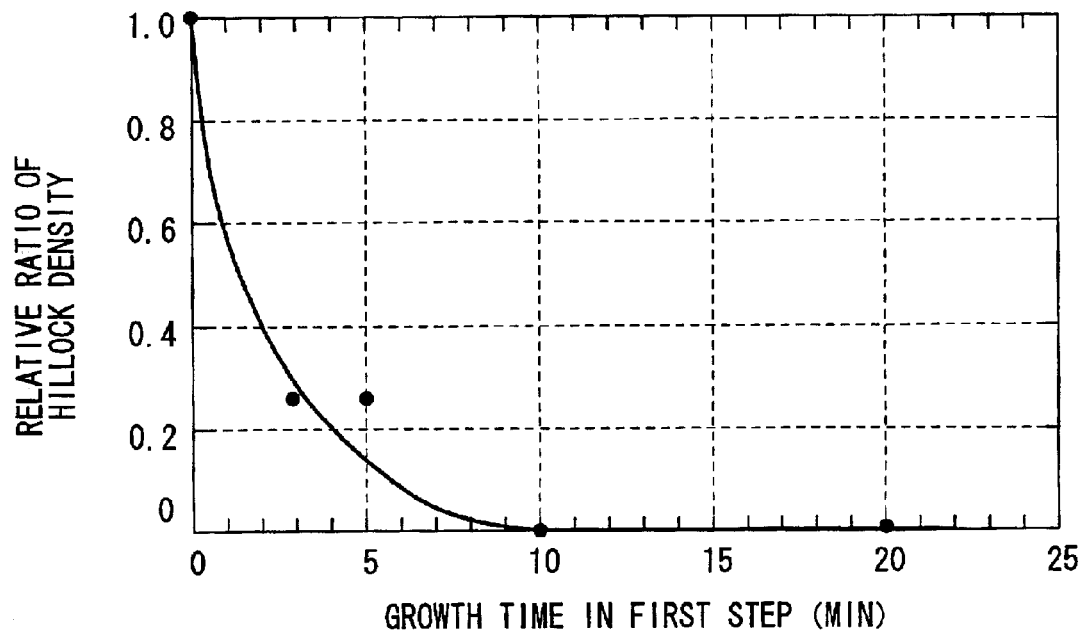
FIG. 7 is a graph showing a hillock relative density with respect to growth time in the first step in the example.

FIG. 7 shows a relation of relative density of hillocks with respect to the growth time in the first step. Under the temperature condition, the critical value of time required in the first step was 10 minutes, so at that time, the relative density of hillocks became 0 in proportion to the time. Even the low temperature growth portion 107a was grown with a longer time, the relative density of hillocks was still 0. The low temperature growth portion 107a grown for 10 minutes in the first step had the height H of 0.5 μm and the width W of 1.0 μm in FIG. 3A. Therefore, it is considered that the temperature growth portion 107a having the height H of at least 0.5 μm is formed in order to prevent the occurrence of hillocks in the nitride semiconductor layer 107 under the above condition.

Figure 8:
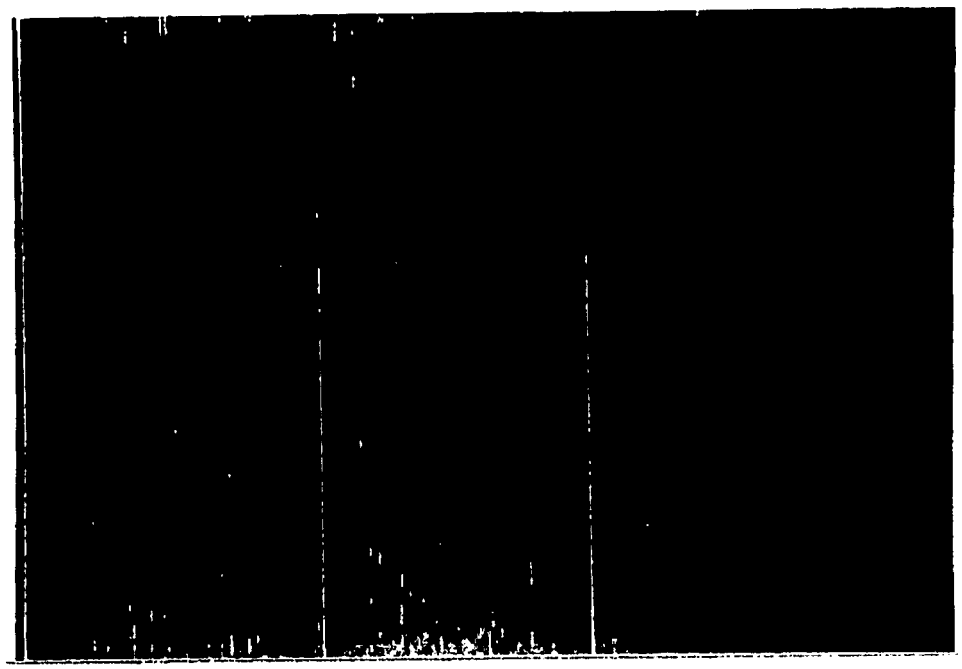
FIG. 8 is a microscope photograph of a nitride semiconductor layer of the example.
Figure 9:
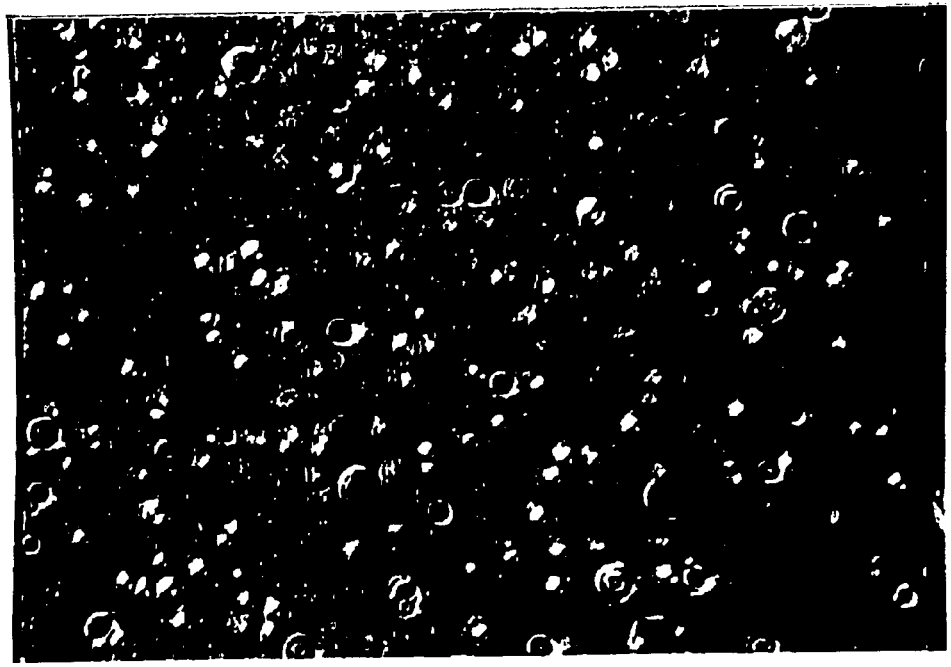
FIG. 9 is a microscope photograph of a nitride semiconductor layer of a comparison.

FIG. 8 is a photograph of the surface of the nitride semiconductor layer 107 grown in two steps in the above manner. FIG. 9 is a photograph of the surface of a nitride semiconductor layer formed through a conventional method as a comparison. In FIG. 9, it is apparent that a large number of hillocks occurred, although no hillock was found in FIG. 8. In the nitride semiconductor layer 107 shown in FIG. 8, a dislocation-free region where no dislocation was found on the surface extended to a portion above the seed crystal portion 105 (refer to FIG. 5A), and the width of the region was 13.5 μm. On the other hand, in the nitride semiconductor layer shown in FIG. 9, a dislocation-free region partially existed, and its width was 9 μm.

Therefore, as shown in the example, it is apparent that the nitride semiconductor layer 107 has a larger low-defective region than ever on the surface thereof, and the surface is uniform and flat. It is also apparent that when the growth temperature in the first step is 1040° C. or less, the nitride semiconductor layer 107 of this kind can be effectively obtained.

In the embodiment, the growth process of the nitride semiconductor layer 107 is divided into two steps by the growth temperature, and in the first step in which growth takes place at a lower temperature, a region above the seed crystal portion 105 is almost formed, so the occurrence of hillocks on the surface of the region can be prevented, and the region can be thinly formed to prevent the thickness of the nitride semiconductor layer 107 from increasing any further. Moreover, the low temperature growth portion 107a formed in the first step has a trapezoidal-shaped cross section in a layer thickness direction, so that the defect density in a region above the seed crystal portion 105 can be reduced. After that, in the second step, the lateral growth is selectively carried out at a higher temperature than in the first step. Therefore, even the growth temperature is higher, the high temperature growth portion 107b can be formed at a higher rate without possibility that defects occur therein.

Moreover, in the embodiment, by varying the growth temperature, the growth direction is changed in two steps, so a crystal is grown in a region in proximity to the seed crystal portion 105 and a region between the seed crystal portions 105 under appropriate conditions. Therefore, on the surface of the nitride semiconductor layer 107, few defects exist except for the meeting portion M1, so a larger low-defective region can be formed. At the same time, the nitride semiconductor layer 107 can be thinly formed with few defects, so the occurrence of warpage can be prevented.

Thus, the nitride semiconductor layer 107 manufactured in this manner has a larger low-defective region with few hillocks on the surface thereof, and a thinner thickness.

[Modification]

A modification is distinguished from the embodiment by the fact that the shape and forming steps of the seed crystal portion 105 in the embodiment is different, and a nitride semiconductor layer 117 is formed. A method of manufacturing the nitride semiconductor layer 117 is described in more detail below.

Figure 10A:
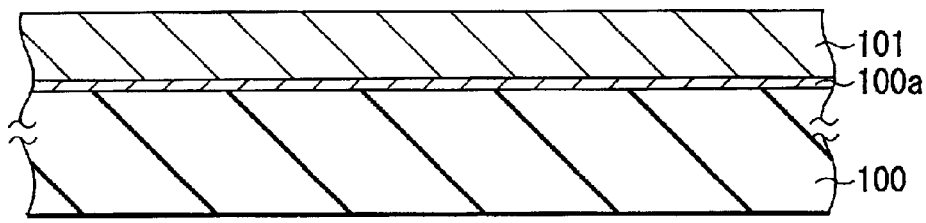
FIGS. 10A, 10B, 10C and 10D are cross-sectional views for explaining steps in a method of manufacturing a nitride semiconductor according to a modification of the first embodiment.

FIGS. 10A to 10D show steps in a method of manufacturing the nitride semiconductor layer 117 in order. Firstly, as shown in FIG. 10A, like the first embodiment, the buffer layer 100a made of, for example, GaN, AlN, AlGaN or the like and the seed crystal layer 101 made of GaN:Si are grown on the substrate 100 in this order.

Figure 10B:
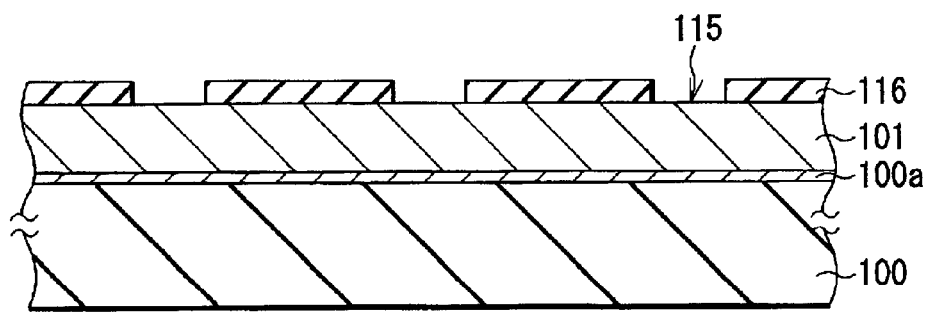

Next, as shown in FIG. 10B, a growth inhibition layer 116 made of $SiO_2$ (silicon oxide) is grown on the surface of the seed crystal layer 101. The growth inhibition layer 116 is formed through, for example, sputtering, and then is formed into a desired shape with apertures, for example, into stripes with a predetermined width and a predetermined period through photolithography and dry etching. At this time, a portion of the seed crystal layer 101 exposed from each of the apertures becomes a seed crystal portion 115.

Next, GaN:Si is grown from the seed crystal portion 115 as a base to form the nitride semiconductor layer 117. Also, in this case, a crystal is grown through changing the growth conditions twice or more. In the modification, the crystal growth is carried out in two steps of growth temperature as in the case of the embodiment.

Figure 10C:
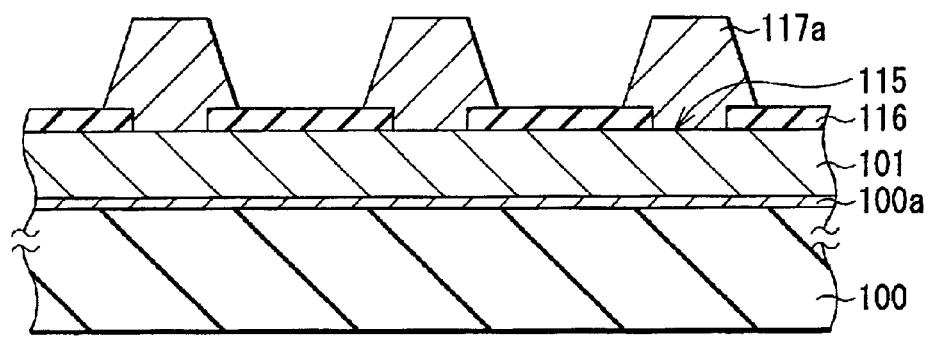

Firstly, the growth temperature in a first step is set at 1040° C. or less, for example, 1030° C. In this case, a GaN:Si crystal is isotropically grown in an upward direction and in a lateral direction from a top surface and sides of the seed crystal portion 115, respectively, at a relatively low rate to form a low temperature growth portion 117a having a trapezoidal-shaped cross section in a layer thickness direction as shown in FIG. 10C. The height H and the width W of the low temperature growth portion 117a from the seed crystal portion 115 are not particularly limited, although, the height H relates to the surface defect density of the nitride semiconductor layer 117, so it is preferable that the low temperature growth portion 117a is grown until the height H reaches to a predetermined value of, for example, 0.5 μm or over. The oblique surfaces of the low temperature growth portion 117a are growth surfaces for lateral growth, which are facets made of {11-22} crystal surfaces.

Figure 10D:
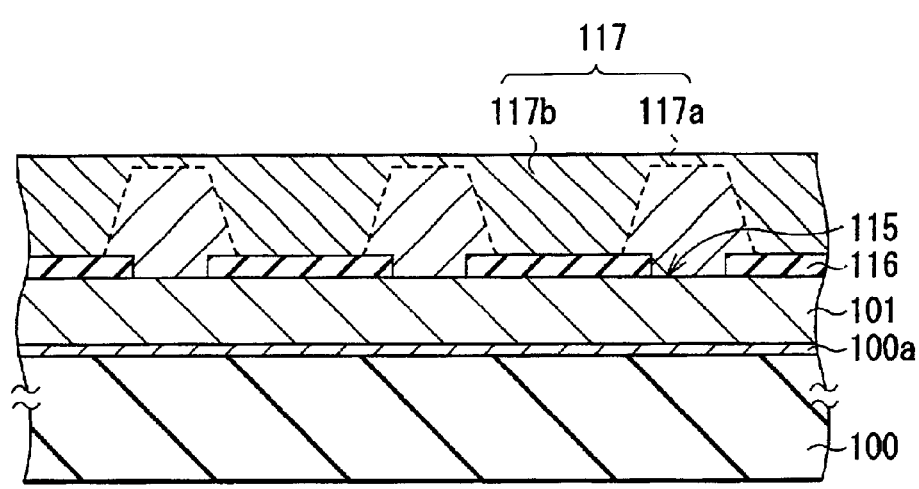

In a second step, the growth temperature is set at 1070° C. or over as well as a higher temperature than the growth temperature in the first step. In this case, the growth temperature is set at, for example, 1070° C. to carry out crystal growth to form a high temperature growth portion 117b. The GaN:Si crystal is generally grown at a higher rate than in the first step, but the growth rate is higher in a lateral direction than in an upward direction from the seed crystal portion 115, so the GaN:Si crystal is mainly grown in a lateral direction. Therefore, compared with the height H and the width W in the first step, in the high temperature growth portion 117b, the height H does not particularly increase, but the width W steeply increases. When the crystal growth is further carried out, crystals meet each other at the center of a region corresponding to a region between the seed crystal portions 115 so as to form one continuous layer. When the crystals are grown until the surface of the layer becomes flat, the nitride semiconductor layer 117 shown in FIG. 10D is completed.

A state in which dislocations propagate in the nitride semiconductor layer 117 is similar to the state in the nitride semiconductor layer 107 of the first embodiment. Therefore, dislocations not only in a region formed through lateral growth but also in a region above the seed crystal portion 115 are very few, so a low-defective region on the surface of the nitride semiconductor layer 117 is extended. As the region above the seed crystal portion 115 is mainly formed of the low temperature growth portion 117a, few hillocks occur on the surface of the nitride semiconductor layer 117. In addition, in the modification, the nitride semiconductor layer 117 is formed through changing the growth temperature step by step. However, any other growth conditions such as growth pressure may be changed step by step.

Thus, in the modification, the growth process of the nitride semiconductor layer 117 is divided into two steps by the growth temperature, the modification can provide the effects equal to those of the first embodiment.

[Second Embodiment]

Figure 11A:
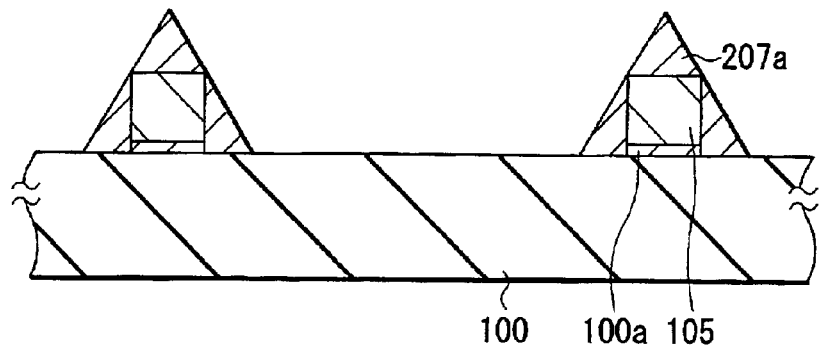
FIGS. 11A, 11B and 11C are cross-sectional views for explaining steps in a method of manufacturing a nitride semiconductor according to a second embodiment of the invention.
Figure 11B:
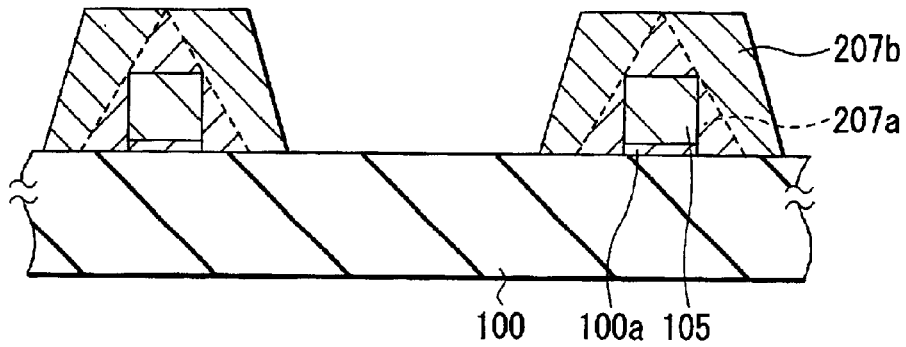
Figure 11C:
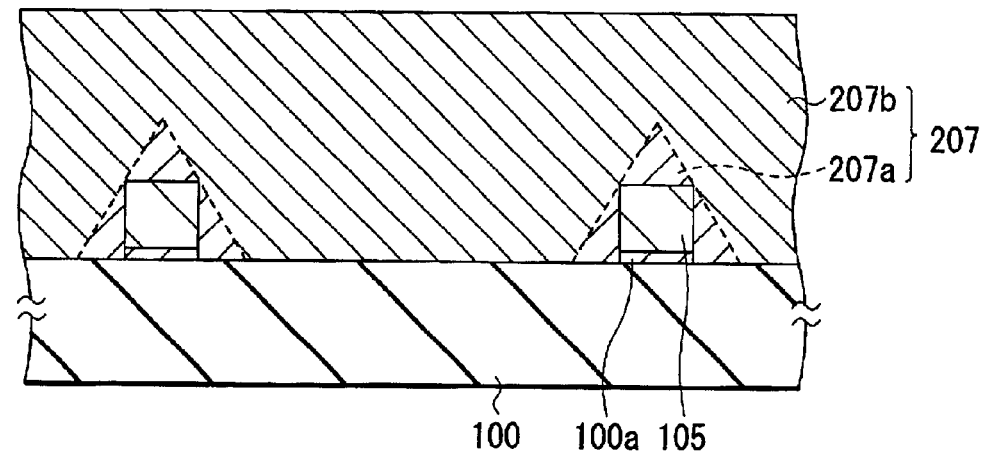
Figure 12A:
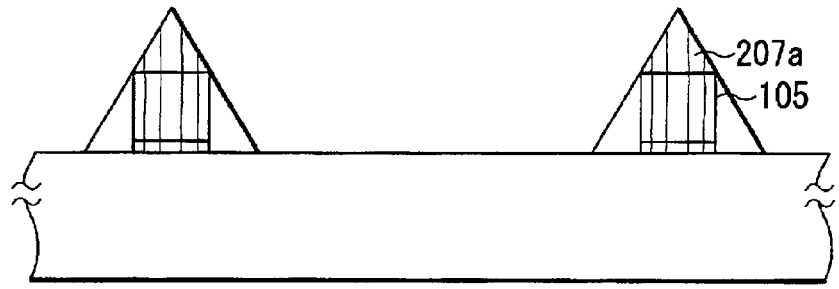
FIGS. 12A, 12B and 12C are cross-sectional views for explaining the occurrence of a dislocation density corresponding to steps of manufacturing a nitride semiconductor.
Figure 12B:
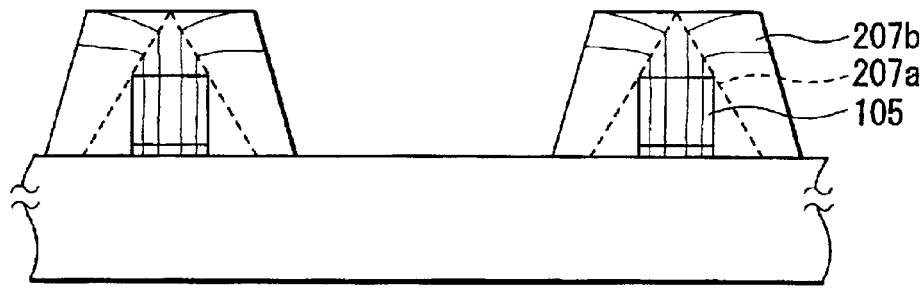
Figure 12C:
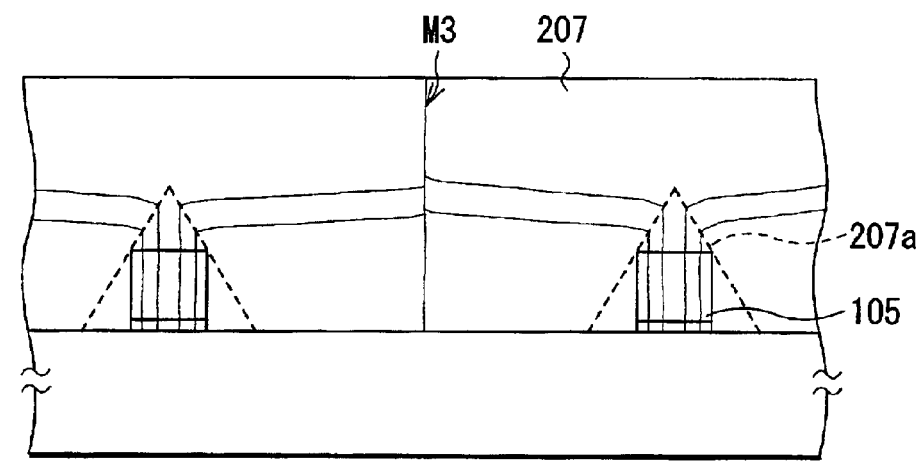

FIGS. 11A, 11B and 11C show steps in a method of manufacturing a nitride semiconductor according to a second embodiment in order, and FIGS. 12A, 12B and 12C show states that dislocations propagate in a crystal growth process corresponding to the manufacturing steps. In the embodiment, a nitride semiconductor layer 207 is formed from the seed crystal portions 105, and at this time, crystal growth is carried out in two steps of growth temperature. In addition, steps of manufacturing the nitride semiconductor layer are the same as of the first embodiment (refer to FIG. A to FIG. 1D) until the step of forming the seed crystal portion 105, so like components are donated by like numerals as of the first embodiment and will not be further explained.

Like the first embodiment, the seed crystal potions 105 are formed on the substrate 100 and the buffer layer 100a in advance. The seed crystal portions 105 are formed into stripes separated from each other, and the extending direction is a <11-00> direction. Firstly, as shown in FIG. 11A, GaN:Si is grown from each of the seed crystal portions 105 as a base to form a second crystal portion 207a. The growth temperature at this time is set at 1000° C. or less, for example, 970° C. Thereby, facets made of {11-22} surfaces appear, and the second seed crystal portion 207a is surrounded by the facets to have a triangular-shaped cross section in a layer thickness direction. In addition, as shown in FIG. 12A, in the second seed crystal portion 207a, threading dislocations from the seed crystal portion 105 vertically extend above the seed crystal portion 105.

Next, as shown in FIGS. 11B and 11C, a high temperature growth portion 207b is grown from the second seed crystal portion 207a as a base. The growth temperature at this time is set at 1050° C. or over, and a crystal is grown in a vertical direction perpendicular to the layer surface as well as in a lateral direction. In the growth step, as shown in FIG. 11B, facets made of crystal surfaces shown in {11$\bar{2}$0} with respect to a lateral direction appear, so the high temperature growth portion 207a has a rectangular-shaped cross section. Further, the crystal surfaces shown in {11$\bar{2}$0} is hereinafter referred to as {11-20}.

Further, in the crystal, as shown in FIG. 12B, dislocations are bended at the {11-22} facets, and propagate to the high temperature growth portion 207b so as to be divided into sides at the point of intersection of two {11-22} facets directly above the seed crystal portion 207a. Thereby, few dislocations and few crystal defects exist a region directly above the seed crystal portion 207a.

When the crystal is further grown, in the high temperature growth portions 207b, regions mainly grown in a lateral direction meet each other at the substantially center of a region corresponding to a region between the seed crystal portions 105 so as to form one continuous layer. When the crystal is grown until the surface of the layer becomes flat, the nitride semiconductor layer 207 shown in FIG. 11C is completed. At this time, as shown in FIG. 12C, dislocations previously propagating to the high temperature growth portion 207b are bended in a lateral direction along the crystal growth, and thereby, few dislocations reach to the surface in a region other than a meeting portion M3. Thereby, a low-defective region on the surface of the nitride semiconductor layer 207 is extended.

In the nitride semiconductor layer 207 manufactured in such a manner, the seed crystal portion 205 having a triangular-shaped cross section is disposed so as to coat the seed crystal portion 105. Dislocations in the nitride semiconductor layer 207 are bended at a boundary between the second seed crystal portion 207a and the high temperature growth portion 207a, so the nitride semiconductor layer 207 has few dislocations coming out of the surface thereof.

In addition, in the embodiment, the growth temperature is changed step by step, although the growth pressure may be changed step by step to form a nitride semiconductor layer equal to the nitride semiconductor layer 207. More specifically, it is preferable that in the step of forming the second seed crystal portion 207a, the growth pressure is set at a higher pressure of, for example, 67 kPa (500 torr) or over, and in the step of forming the high temperature growth portion 207b, the growth pressure is set at a lower pressure of, for example, 40 kPa (300 torr) or less. Thereby, the same effects as in the case that the growth temperature is changed can be obtained. Further, both of growth temperature and growth pressure may be changed at the same time, or any other growth conditions (such as the kind of atmospheric gas) which will provide the same effects as those of the growth temperature and the growth pressure on crystal growth can be used in the same manner.

In the embodiment, the growth process of the nitride semiconductor layer 207 is divided into two steps by the growth temperature, and in the first step in which growth takes place at a lower temperature (or higher pressure), the second seed crystal portion 207a is formed so as to have a triangular-shaped cross section in a layer thickness direction, so no dislocations propagate from the second seed crystal portion 207a in a region above the second seed crystal portion 207a during growth in the second step. Thereby, a larger low-defective region can be easily formed on the surface of the nitride semiconductor layer 207.

Moreover, the nitride semiconductor layer 207 is grown from the second seed crystal portion 207a having a triangular-shaped cross section in a layer thickness direction as a base, so few dislocations propagate to the surface thereof except for the meeting portion M3 so that a larger low-defective region can be obtained.

[Modification]

A modification is distinguished from the embodiment by the fact that the shape and forming steps of the seed crystal portion 105 in the embodiment is different, and a nitride semiconductor layer 217 is formed. A method of manufacturing the nitride semiconductor layer 217 is described in more detail below.

Figure 13A:
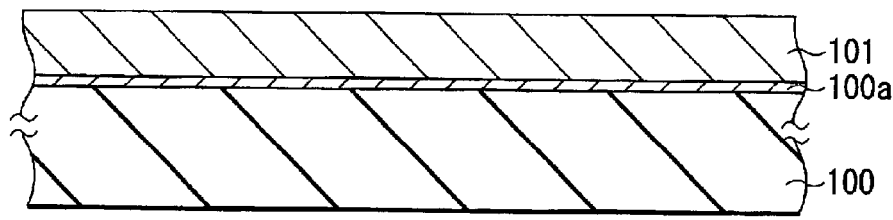
FIGS. 13A, 13B, 13C and 13D are cross-sectional views for explaining steps in a method of manufacturing a nitride semiconductor according to a modification of the second embodiment.

FIGS. 13A to 13D show steps in a method of manufacturing the nitride semiconductor layer 217 in order. Firstly, as shown in FIG. 13A, like the second embodiment, the buffer layer 100a made of, for example, GaN, AlN or AlGaN and a seed crystal layer 201 made of GaN:Si are grown on the substrate 100 in this order.

Figure 13B:
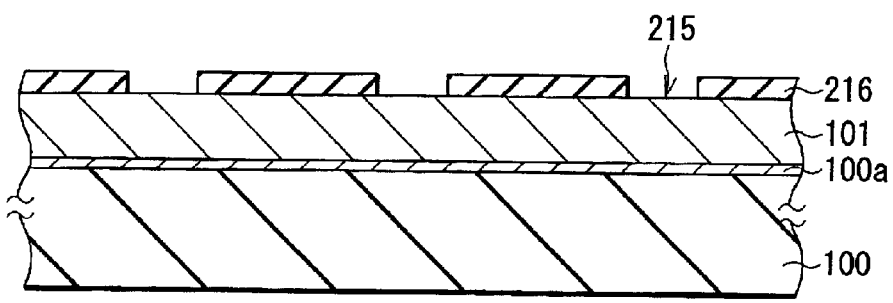

Next, as shown in FIG. 13B, a growth inhibition layer 216 made of $SiO_2$ (Silicon oxide) is formed on the surface of the seed crystal layer 201. The growth inhibition layer 216 is formed through, for example, sputtering, and then is formed in a desired shape with apertures, for example, stripes with a predetermined width and a predetermined period through photolithography and dry etching. At this time, a portion of the seed crystal layer 201 exposed from each of the apertures becomes a seed crystal portion 215. For example, the seed crystal portions 215 are formed into stripes separated from each other, and the extending direction is a <11-00> direction.

Figure 13C:
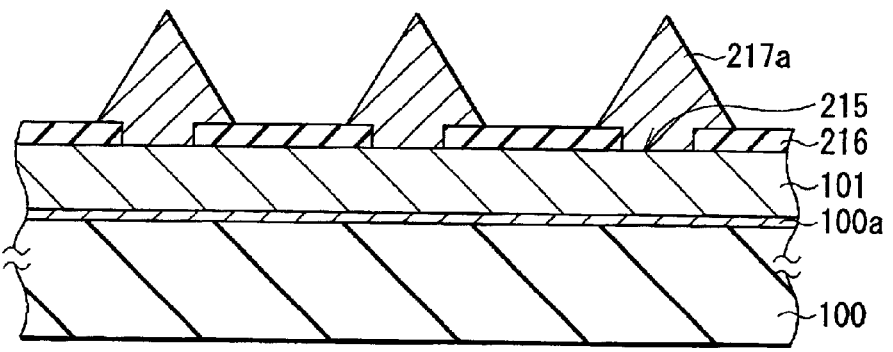

Next, as shown in FIG. 13C, GaN:Si is grown from each of the seed crystal portions 215 as a base to form a second crystal portion 217a. The growth temperature at this time is set at 1000° C. or less, for example, 970° C. Thereby, facets made of {11-20} surfaces appear, and the second seed crystal portion 217a is surrounded by the facets to have a triangular-shaped cross section in a layer thickness direction. At this time, in the second seed crystal portion 217a, threading dislocations from the seed crystal portion 215 vertically extend above the seed crystal portion 215.

Figure 13D:
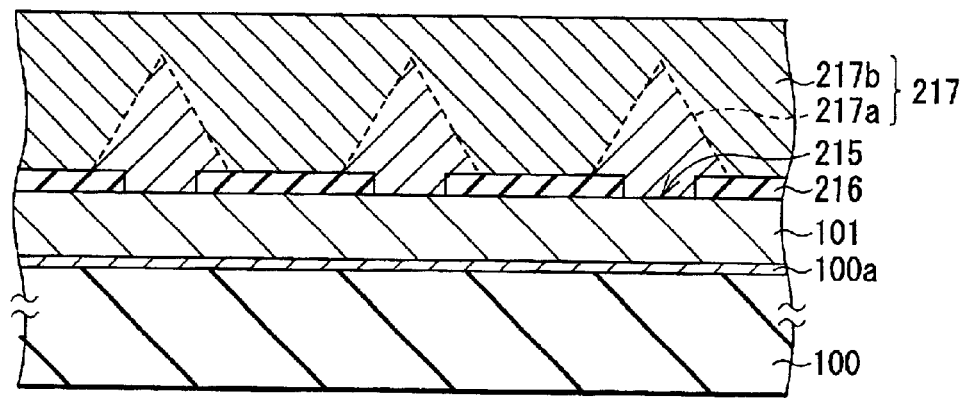

Next, a high temperature growth portion 217b is grown from the second seed crystal portion 217a as a base. The growth temperature at this time is set at 1050° C. or over, and a crystal is grown in a vertical direction perpendicular to the layer surface as well as in a lateral direction. When the crystal is further grown, in the high temperature growth portion 217b, regions mainly grown in a lateral direction meet each other at the substantially center of a region corresponding to a region between the seed crystal portions 215 so as to form one continuous layer. When the crystal is grown until the surface of the layer becomes flat, the nitride semiconductor layer 217 shown in FIG. 13D is completed. A state that dislocations propagate during the growth in the nitride semiconductor layer 217 is the same as that in the nitride semiconductor layer 207 of the second embodiment. Thereby, few dislocations and few crystal defects exist in a region directly above the second seed crystal portion 217a, so a low-defective region on the surface of the nitride semiconductor layer 217 is extended.

In addition, in the modification, the growth temperature is changed step by step to form the nitride semiconductor layer 117, but as described in the second embodiment, any other growth conditions such as growth pressure may be changed step by step.

Thus, in the modification, the growth process of the nitride semiconductor layer 217 is divided into two steps by the growth temperature, so the modification can provide the same effects as those of the second embodiment.

In the above manner, after growing the nitride semiconductor layers 107, 117, 207 or 217, a semiconductor layer can be grown thereon to manufacture a semiconductor device. As an example of such a semiconductor device, a semiconductor laser and its manufacturing method are described below.

[Third Embodiment]

Figure 14:
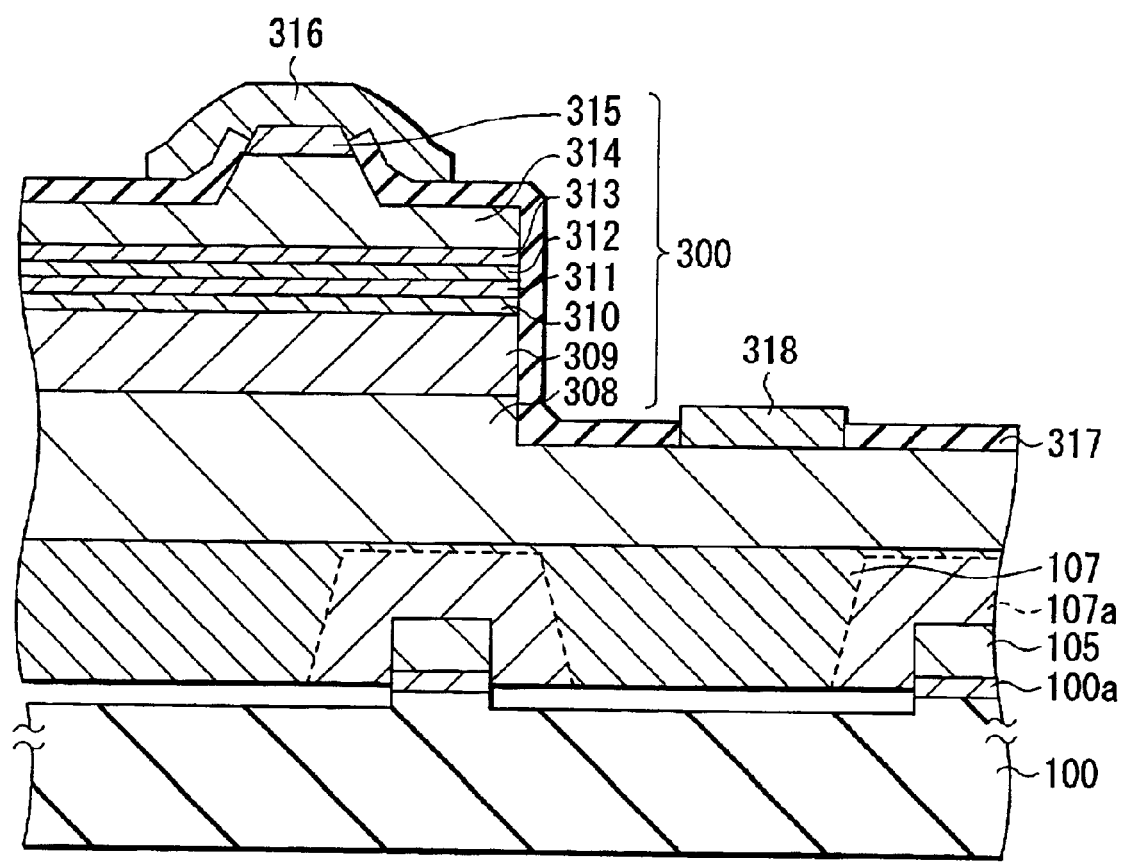
FIG. 14 is a cross-sectional view of a semiconductor laser device according to a third embodiment of the invention.

FIG. 14 shows a cross-sectional configuration of a semiconductor laser according to a third embodiment. The semiconductor laser comprises a semiconductor layer 300 (308 through 315) formed on the nitride semiconductor layer 107 according to the first embodiment.

The semiconductor layer 300 is made of a nitride semiconductor, and includes an n-side contact layer 308, an n-type cladding layer 309, an n-type guide layer 310, an active layer 311, a crystal deterioration prevention layer 312, a p-type guide layer 313, a p-type cladding layer 314 and a p-side contact layer 315 laminated in this order from the side of, for example, the nitride semiconductor layer 107. Among them, the n-side contact layer 308 is formed of GaN:Si with a thickness of, for example, 1.5 $\mu$m, and the n-type cladding layer 309 is formed of n-type $Al_{0.08}Ga_{0.92}N$ with a thickness of, for example, 1.0 $\mu$m, then n-type guide layer 310 is formed of n-type GaN with a thickness of, for example, 0.1 $\mu$m. An n-side contact layer of a laser typically requires a sufficient thickness because of a direction of current flowing through the layer. In the embodiment, the n-side contact layer 308 and the nitride semiconductor layer 307, which is formed of the same n-type GaN, function as substantial n-side contact layers.

The active layer 311 has a multiple quantum well structure formed of a $Ga_{0.98}In_{0.02}N/Ga_{0.92}In_{0.08}N$ multilayer film with a thickness of, for example, 30 nm. The active layer 311 has a current injection region where a current is injected, and the current injection region functions as a light-emitting region.

The crystal deterioration prevention layer 312 is formed of n-type $Al_{0.18}Ga_{0.82}N$ with a thickness of, for example, 5 nm to 20 nm. The p-type guide layer 313 is formed of p-type GaN with a thickness of, for example, 0.1 μm. The p-type cladding layer 314 is formed of p-type $Al_{0.14}Ga_{0.86}N$/GaN with a thickness of, for example, 0.8 μm. The p-side contact layer 315 is formed of p-type GaN with a thickness of, for example, 0.5 μm.

The p-side contact layer 315 through a portion of the n-side contact layer 308 are formed as a projected portion of a stripe shape (extending in a direction perpendicular to the paper surface in FIG. 14) so as to be disposed in a predetermined region. This is a so-called laser stripe. A region where the n-side contact layer 308 is exposed is a region for disposing an n-side electrode 318 to be described later.

Further, in this case, the p-side contact layer 315 and a portion of the p-type cladding layer 314 are formed into a thin stripe-shaped projected portion extending in the same direction as of the laser stripe to form a current narrowing portion. The current narrowing portion is for limiting the current injection region so as to locally inject a current in the active layer 311. Therefore, the current injection region is disposed in a position corresponding to the current narrowing portion. In order to prevent or reduce deterioration in device properties, the current narrowing portion which is a base of the current injection region is preferably disposed in a low-defective region of the semiconductor layer. In this case, the low-defective region is a region between the meeting portions M1. When defects occur in a region above the seed crystal portion 105, the low-defective region may be a region between the seed crystal portion 105 and the meeting portion M1.

On the semiconductor layer 300, an insulating layer 317 formed of, for example, silicon dioxide ($SiO_2$) is disposed. The insulating layer 317 has apertures in a part corresponding to the current narrowing portion and a part of a portion corresponding to the n-side contact layer 308, on which a p-side electrode 316 and an n-side electrode 318 are formed, respectively. The p-side electrode 316 has a structure including, for example, Ni (nickel), Pt (platinum) and Au (gold) laminated in order, and is electrically conducted with the p-side contact layer 315. The n-side electrode 318 has a structure including, for example, Ti (titanium), Al (aluminum), Pt and Au laminated in order, and is electrically conducted with the n-side contact layer 308.

Further, in the laser, a pair of side surfaces opposed to each other in an extending direction of the laser stripe are resonator end surfaces, and on the resonator end surfaces, a pair of reflective mirror films (not shown) are disposed. These reflective mirror films are designed so as to have different reflectances. Thereby, light generated in the active layer 311 travels between the reflective mirror films so as to be amplified, and then the light as a laser beam is emitted from the reflective mirror film having a lower reflectance.

The semiconductor laser can be manufactured in the following manner, for example.

Firstly, on a flat surface of the nitride semiconductor layer 107 formed through the method according to the first embodiment, the semiconductor layer 300 (308 through 315) is grown through, for example, MOCVD. More specifically, the n-side contact layer 308 formed of GaN:Si with a thickness of 1.5 μm, the n-type cladding layer 309 formed of n-type $Al_{0.08}Ga_{0.92}N$ with a thickness of 1.0 μm and the guide layer 310 formed of n-type GaN with a thickness of 0.1 μm are grown in order. On the guide layer 310, the active layer 311 having a multiple quantum well structure of a $Ga_{0.98}In_{0.02}N/Ga_{0.92}In_{0.08}N$ multilayer film is formed. Then, the crystal deterioration prevention layer 312 formed of n-type $Al_{0.18}Ga_{0.82}N$, the guide layer 313 formed of p-type GaN with a thickness of 0.1 μm, the p-type cladding layer 314 formed of p-type $Al_{0.14}Ga_{0.86}N$/GaN with a thickness of 0.5 μm and the p-side contact layer 315 formed of p-type GaN with a thickness of 0.1 μm are grown on the active layer 311. In this case, as the semiconductor layer 300 is grown on the flat surface of the nitride semiconductor layer 107 where fewer defects such as hillocks and fewer dislocations exist, dislocations and defects in each layer derived from the crystal substrate are reduced. Further, as the nitride semiconductor layer 107 is so thin that it is difficult for the internal stress thereof to increase, the occurrence of warpage can be prevented.

Next, the p-side contact layer 315 and the p-type cladding layer 314 are patterned in a thin stripe shape through, for example, dry etching to form the current narrowing portion. As described above, the current narrowing portion is preferably formed on a low-defective region between the meeting portions M1 (refer to FIG. 5A) so as to specifically correspond to the low-defective region. A position of the light-emitting region determined according to the position of the current narrowing portion is aligned with a low defective portion of the active layer 311, so that deterioration in device properties can be prevented. Further, in order to more reliably dispose the light-emitting region in a low dislocation density region, the current narrowing portion is preferably formed corresponding to a region between the seed crystal portion 105 and the meeting portion M1. In the semiconductor layer 300, the occurrence of defects is concentrated in the vicinity of the meeting portion M1, so a region between the meeting portions M1 is substantially a large low-defective region. Therefore, it is not necessary to allow a large margin from the meeting portion M1, so the current narrowing portion can be aligned with relative ease. Alternatively, it is not necessary to strictly limit the forming position of the current injection region, so difficulties in the manufacturing process due to accuracy can be avoided.

Next, predetermined parts of the p-type cladding layer 314 through the n-side contact layer 308 are removed through photolithography or the like to expose the n-side contact layer 308, then the forming region of the n-side electrode 318 is formed. Then, the whole exposed parts of the n-side contact layer 308 through the p-side contact layer 315 are coated with the insulating film 317, and on the n-side contact layer 308, the n-side electrode 318 is formed, and on the p-side contact layer 315, the p-side electrode 316 is formed. The n-side electrode 318 is formed through depositing, for example, Ti (titanium), Al (aluminum), Pt (platinum) and Au (gold) in this order. The p-side electrode 316 is formed through depositing, for example, Ni (nickel), Pt and Au in this order. Thus, the semiconductor laser shown in FIG. 14 can be obtained.

In the semiconductor laser, when a predetermined voltage is applied between the p-side electrode 316 and the n-side electrode 318, a current is injected into the active layer 311, and light emission occurs by an electron-hole recombination. The light is reflected by the reflective mirror films (not shown) to lase, and then the light is emitted to the outside as a beam. In this case, the semiconductor layer 300 is grown on the nitride semiconductor layer 107, so the defect density of the semiconductor layer 300 is lower. Specifically, when the current injection region of the active layer 311 is disposed between the meeting portions M1, the defect density of the current injection region is reduced. Therefore, the device resists being deteriorated and the life of the device increases.

Thus, according to the embodiment, as the semiconductor layer 300 is grown on the nitride semiconductor layer 107 having a larger low-defective region on the surface thereof, defects in the semiconductor layer 300 can be reduced and the crystallinity of the semiconductor layer 300 can be improved. Therefore, the semiconductor layer 300 resists being deteriorated due to the application of voltage, and the life of the semiconductor laser can increase. Further, the probability of non-radiative recombination due to threading dislocations or the like can be reduced, and light emission efficiency can be improved.

In addition, when the current injection region of the active layer 311 is disposed between the meeting portions M1, the light emission efficiency can be further improved. Moreover, a region between the meeting portions M1 is sufficiently large, compared with the width of a typical current injection region, so a design margin of the current injection region can be extended. Thereby, such a semiconductor can be easily manufactured.

Further, the semiconductor layer 300 is grown on the nitride semiconductor layer 107 thinly formed, so a stress produced in the nitride semiconductor layer 107 can be reduced, and thereby, the occurrence of warpage in the device can be prevented.

Figure 15:
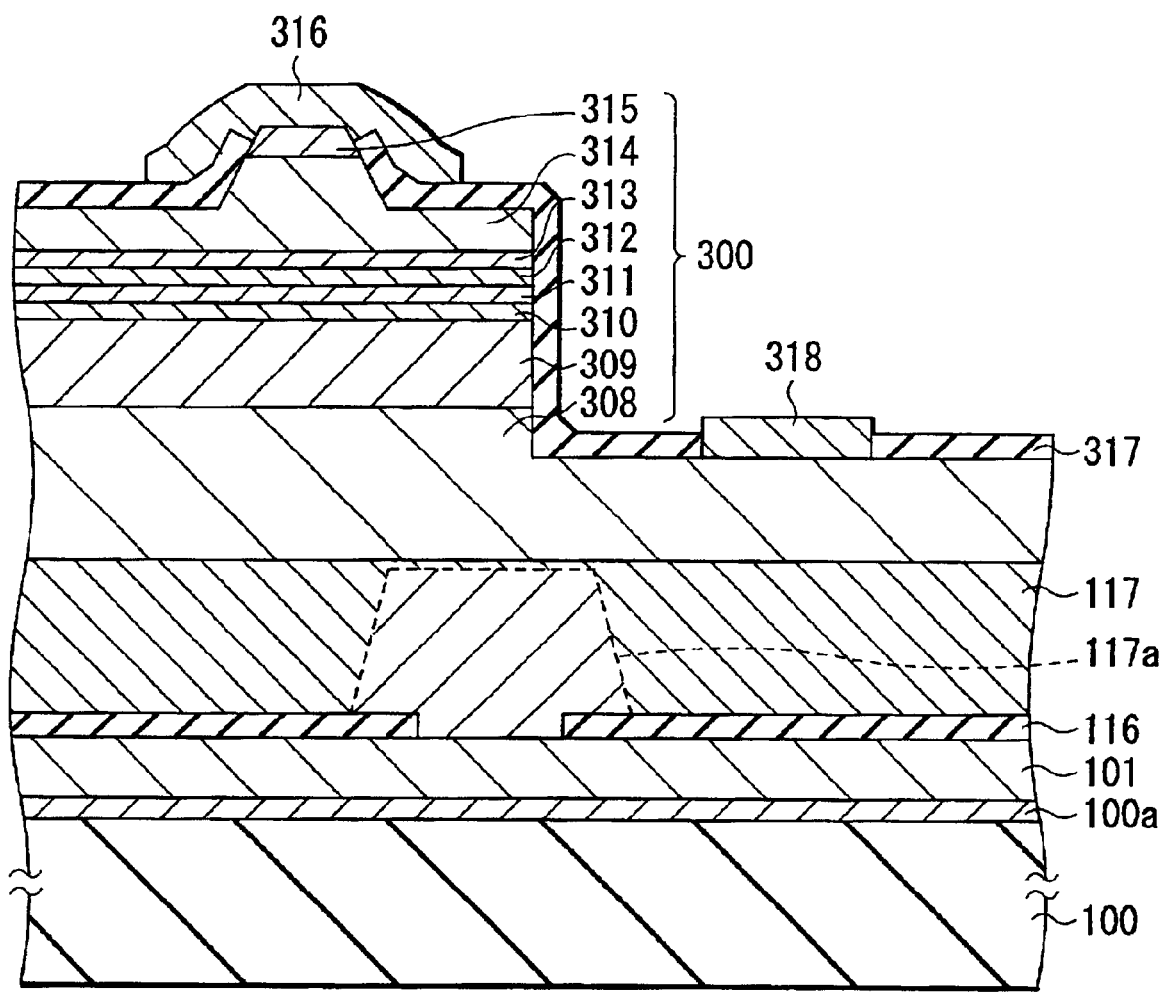
FIG. 15 is a cross-sectional view of another semiconductor laser device according to the invention.

Although the invention is described referring to the embodiments and examples, the invention is not limited to the embodiments and examples, and is applicable for various modifications. For example, in the third embodiment, the semiconductor laser is manufactured by the use of the nitride semiconductor layer 107 formed through the method according to the first embodiment, although any other nitride semiconductor in the invention may be used instead of the nitride semiconductor layer 107. Even in this case, the same effects as of the third embodiment can be obtained. For example, FIG. 15 shows a cross-sectional configuration of a semiconductor laser manufactured through forming the nitride semiconductor layer 117 according to the modification of the first embodiment and forming the semiconductor layer 300 on the nitride semiconductor layer 117. Even in this case, a current narrowing portion is disposed so as to correspond to a region between the meeting portions M1. Further, when the nitride semiconductor layer 207 or 217 according to the second embodiment or the modification of the second embodiment, respectively, is used, defects in a region above the seed crystal portion can be effectively reduced, so the crystallinity of the semiconductor layer 300 can be improved, as well as a larger margin of a region where the current narrowing portion is disposed can be allowed.

Figure 16:
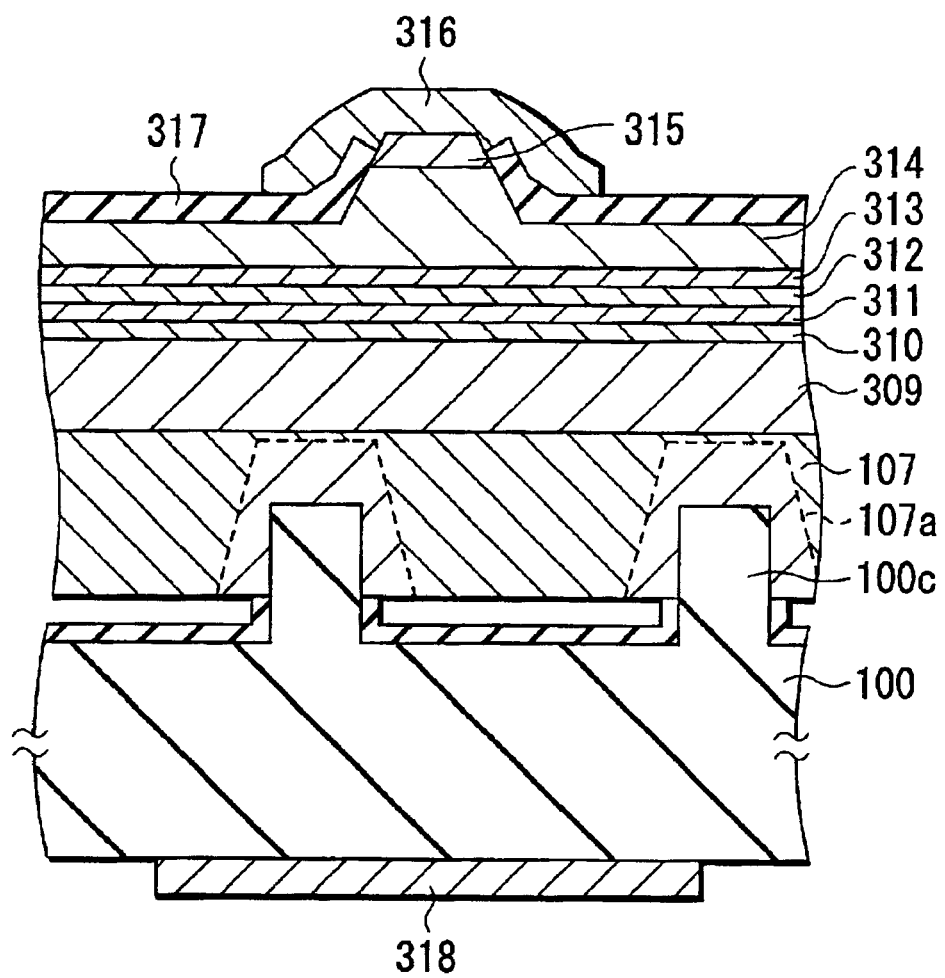
FIG. 16 is a cross-sectional view of a still another semiconductor laser device according to the invention.

Moreover, in the embodiments, the case where the substrate 100 made of sapphire or the like is described, but the invention is applicable for substrates made of any other materials. Specifically, when using a GaN substrate, an n-side electrode is disposed on the back of the substrate. Thereby, it is not necessary to process the surface of the substrate to dispose the n-side electrode, and the n-side contact layer is not required to be disposed, so the manufacturing process can be simplified, and the size of the laser can be reduced. In this case, as shown in FIG. 16, a seed crystal portion 100c may be formed directly on a surface of a GaN substrate 110, so the semiconductor layer 300 can be formed on the nitride semiconductor layer 107 grown from the seed crystal portion 100c to manufacture the laser.

Still further, the invention is applicable for the case that the nitride semiconductor layer 107, 117, 207 or 217 formed on the sapphire substrate or the like according to the embodiments is removed from the substrate to manufacture a semiconductor device such as laser thereon.

Moreover, in the embodiments, the surface of the substrate is the {0001} surface, but it may be any other crystal surface. Likewise, the seed crystal portion is extended in a <1-100> direction to be formed, but it can be extended in any other direction to be formed. Further, the oblique surfaces of the second seed crystal portion are not necessarily the {11-22} surfaces or the {11-20} surfaces. In addition, the seed crystal portion is not limited to be formed into a stripe shape, and for example, it can be formed into a lattice shape, a island shape, or the like.

In addition, in the above embodiments, the semiconductor laser is taken as a semiconductor device, and the configuration of the semiconductor laser is specifically exemplified above. However, the invention is applicable for any other semiconductor lasers having other configurations. For example, the n-type guide layer 110, the p-type guide layer 113, or the deterioration prevention layer 112 is not necessarily included. Further, in the above embodiments, a ridge waveguide type semiconductor which is a combination of a gain waveguide type and a refractive index waveguide type is described as an example, although the invention is applicable for a gain waveguide type semiconductor laser and a refractive index waveguide type semiconductor laser.

Moreover, in the above embodiments, the semiconductor laser is described as an example of the semiconductor device, although the invention is applicable for any other semiconductor devices such as light-emitting diode, field effect transistor and so on.

As described above, according to the nitride semiconductor and the semiconductor device of the invention, the second seed crystal portion having a triangular-shaped or trapezoidal-shaped cross section in a layer thickness direction and the semiconductor layer grown from the second crystal portion as a base are comprised, so dislocations in the crystal are bended at an interface between the second seed crystal portion and the semiconductor layer, and thereby, a low-defective region on the surface can be extended, and hillocks can be reduced. Therefore, in the semiconductor device formed by the use of the nitride semiconductor, defects in the semiconductor layer can be reduced, and the reliability and the stability of the semiconductor device can be improved.

According to a method of manufacturing a nitride semiconductor of the invention and a method of manufacturing a semiconductor device of the invention, a step of growing a Group III–V nitride semiconductor from a seed crystal portion as a base through changing at least one of growth conditions in two or more steps to form a semiconductor layer is comprised, so a crystal is grown in the vicinity of the seed crystal portion and in a region between the seed crystal portions under different conditions, and dislocations in the crystal is bended at an interface between the second seed crystal portion and the semiconductor layer. Therefore, a larger low-defective region on the surface of the semiconductor layer can be formed, and the occurrence of hillocks can be prevented, and thereby the reliability and stability of the semiconductor device formed by the use of the nitride semiconductor can be improved. Further, the thickness of the semiconductor layer can be controlled so as to be thinly formed, and thereby the occurrence of warpage in the semiconductor device formed by the use of the nitride semiconductor can be prevented.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a nitride semiconductor comprising:
   growing a Group III–V nitride semiconductor to form a striped seed crystal portion; and
   growing a Group III–V nitride semiconductor from the seed crystal portion as a base through changing at least one of growth conditions in two or more steps to form a semiconductor layer.

2. A method of manufacturing a nitride semiconductor according to claim 1, wherein forming the semiconductor layer is carried out through changing at least either of a growth temperature and a growth pressure.

3. A method of manufacturing a nitride semiconductor according to claim 2, wherein forming the semiconductor layer includes:
   a first step carried out at a first temperature and a first pressure; and
   a second step carried out at a second temperature higher than the first temperature or a second pressure lower than the first pressure.

4. A method of manufacturing a nitride semiconductor according to claim 3, wherein the seed crystal portion comprises a first seed crystal portion, and wherein:
   in the first step, the semiconductor layer is grown to form a second seed crystal portion; and
   in the second step, the semiconductor layer is grown to from the second seed crystal portion as a base mainly in a direction parallel to a layer surface.

5. A method of manufacturing a nitride semiconductor according to claim 4, wherein the semiconductor layer is grown to a desired thickness in a layer thickness direction to form the second seed crystal portion.

6. A method of manufacturing a nitride semiconductor according to claim 5, wherein the second seed crystal portion is formed so as to have a trapezoidal-shaped cross section in a layer thickness direction.

7. A method of manufacturing a nitride semiconductor according to claim 6, wherein in the first step, the semiconductor layer is grown at a temperature of 1040° C. or less.

8. A method of manufacturing a nitride semiconductor according to claim 6, wherein in the second step, the semiconductor layer is grown at a temperature of 1070° C. or more.

9. A method of manufacturing a nitride semiconductor according to claim 6, wherein in the first step, the semiconductor layer is grown at a 1-to-2 growth rate ratio of a layer thickness direction to a direction parallel to a layer surface.

10. A method of manufacturing a nitride semiconductor according to claim 6, wherein in the second step, the semiconductor layer is grown at a 1-to-10 growth rate ratio of a layer thickness direction to a direction parallel to a layer surface.

11. A method of manufacturing a nitride semiconductor according to claim 4, wherein the second seed crystal portion is formed so as to have a triangular-shaped cross section in a layer thickness direction.

12. A method of manufacturing a nitride semiconductor according to claim 11, wherein the second seed crystal portion is formed of facets.

13. A method of manufacturing a nitride semiconductor according to claim 11, wherein in the first step, the semiconductor layer is grown at a temperature of 1000° C. or less.

14. A method of manufacturing a nitride semiconductor according to claim 11, wherein in the first step, the semiconductor layer is grown at a pressure of 67 kPa or more.

15. A method of manufacturing a nitride semiconductor according to claim 11, wherein in the second step, the semiconductor layer is grown at a temperature of 1050° C. or more.

16. A method of manufacturing a nitride semiconductor according to claim 11, wherein in the second step, the semiconductor layer is grown at a pressure of 40 kPa or less.

17. A method of manufacturing a nitride semiconductor according to claim 4, wherein after the second step, the semiconductor layer is grown at a lower temperature than the temperature in the second step.

18. A method of manufacturing a nitride semiconductor according to claim 1, wherein a crystal is grown on a substrate to form a Group III–V nitride semiconductor layer, and a growth inhibition layer having an aperture potion is disposed on the surface of the Group III–V nitride semiconductor layer to form the seed crystal portion.

19. A method of manufacturing a nitride semiconductor according to claim 1, wherein after a crystal is grown on a substrate to form a Group III–V nitride semiconductor layer, the Group III–V nitride semiconductor layer is partially removed to form the seed crystal portion.

20. A method of manufacturing a nitride semiconductor according to claim 1, wherein the seed crystal portion is formed into stripes extending in a direction indicated in <1$\bar{1}$00>.

21. A method of manufacturing a nitride semiconductor according to claim 1, wherein the Group III–V nitride semiconductor is a gallium nitride compound semiconductor.

22. A method of manufacturing a semiconductor a semiconductor device comprising:
   growing a Group III–V nitride semiconductor to form a striped seed crystal portion; and
   growing a Group III–V nitride semiconductor from the seed crystal portion as a base through changing at least one growth condition in two or more steps to form a semiconductor layer.

23. A method of manufacturing a semiconductor device according to claim 22, wherein the seed crystal portion is a first seed crystal portion, and wherein forming the semiconductor layer includes:
   a first step of forming a second seed crystal portion at a first temperature and a first pressure, and
   a second step of growing the semiconductor layer mainly in a direction parallel to a layer surface from the second seed crystal portion as a base at a second temperature higher than the first temperature or a second pressure lower than the first pressure.

24. A method of manufactoring a semiconductor device according to claim 22, wherein:
   in the semiconductor layer, a plurality of meeting portions is formed through growing the semiconductor layer in a direction different from a layer thickness direction; and
   an active layer is formed as the semiconductor layer, and a current injection region of the active layer is formed so as to correspond to a region between the meeting portions.

25. A method of manufacturing a semiconductor device according to claim 24, wherein the current injection is formed so as to correspond to a region between the seed crystal portion and the meeting portions.

26. A method of manufacturing a nitride semiconductor comprising:
   growing a Group III–V nitride semiconductor to form a discontinuous seed crystal portion; and
   growing a Group III–V nitride semiconductor from the seed crystal portion as a base through changing at least one growth condition in two or more steps to form a semiconductor layer.

27. A method of manufacturing a nitride semiconductor comprising:
   growing a Group III–V nitride semiconductor to form a seed crystal portions; and
   growing a Group III–V nitride semiconductor from the seed crystal portion as a base through changing at least one growth condition in two or more steps to form a semiconductor layer;
   wherein after a crystal is grown on a substance to form a Group III–V nitride semiconductor layer, the Group III–V nitride semiconductor layer is partially removed to form the seed crystal portion.

* * * * *